(12) United States Patent
Wu et al.

(10) Patent No.: US 8,461,603 B2
(45) Date of Patent: Jun. 11, 2013

(54) LAMP MODULE

(75) Inventors: Hsiang-Chen Wu, Taoyuan Hsien (TW); Liming Chen, Taoyuan Hsien (TW)

(73) Assignee: Delta Electronics, Inc., Kuei San, Taoyuan Hsien (TW)

( * ) Notice: Subject to any disclaimer, the term of this patent is extended or adjusted under 35 U.S.C. 154(b) by 0 days.

(21) Appl. No.: 13/098,049

(22) Filed: Apr. 29, 2011

(65) Prior Publication Data

US 2012/0043560 A1 Feb. 23, 2012

(30) Foreign Application Priority Data

Aug. 19, 2010 (TW) .............................. 99127638 A (51) Int. Cl.
*H01L 33/62* (2010.01)
*H01R 13/447* (2006.01)

(52) U.S. Cl.
USPC ...................... 257/88; 257/E33.066; 174/520

(58) Field of Classification Search
USPC ................................................... 362/249.02
See application file for complete search history.

(56) References Cited

U.S. PATENT DOCUMENTS

| | | | |
|---|---|---|---|
| 6,874,910 B2 * | 4/2005 | Sugimoto et al. ............. | 362/294 |
| 6,999,318 B2 * | 2/2006 | Newby .......................... | 361/719 |
| 7,635,915 B2 * | 12/2009 | Xie et al. ...................... | 257/692 |
| 7,674,000 B2 * | 3/2010 | Valerio et al. ................ | 362/97.3 |
| 7,914,162 B1 * | 3/2011 | Huang ........................... | 362/92 |
| 7,922,372 B2 * | 4/2011 | Li ................................. | 362/373 |
| 8,007,131 B2 * | 8/2011 | Liu et al. ...................... | 362/267 |
| 8,100,560 B2 * | 1/2012 | Ahland et al. ................ | 362/267 |
| 2007/0029570 A1 * | 2/2007 | Shin et al. ...................... | 257/99 |
| 2008/0273327 A1 * | 11/2008 | Wilcox et al. ................ | 362/267 |
| 2009/0251906 A1 * | 10/2009 | Liu et al. ...................... | 362/431 |
| 2009/0262544 A1 * | 10/2009 | Wu ................................ | 362/459 |
| 2009/0290345 A1 * | 11/2009 | Shaner ...................... | 362/249.01 |
| 2009/0303711 A1 * | 12/2009 | Remus et al. ................ | 362/234 |
| 2009/0323328 A1 * | 12/2009 | Wang et al. .................. | 362/235 |
| 2010/0046224 A1 * | 2/2010 | Lin ......................... | 362/249.02 |
| 2010/0085751 A1 * | 4/2010 | Shaner ..................... | 362/249.02 |
| 2010/0103660 A1 * | 4/2010 | van de Ven et al. .......... | 362/231 |
| 2010/0110684 A1 * | 5/2010 | Abdelsamed et al. ... | 362/249.02 |
| 2010/0149806 A1 * | 6/2010 | Yiu .......................... | 362/249.02 |
| 2010/0195326 A1 * | 8/2010 | Boxler et al. ................ | 362/235 |

* cited by examiner

*Primary Examiner* — Thomas L Dickey
*Assistant Examiner* — Joseph Schoenholtz
(74) *Attorney, Agent, or Firm* — Muncy, Geissler, Olds & Lowe, PLLC (57) ABSTRACT

A lamp module is provided, including a circuit board, at least an LED, an insulator and a metal barrier. The LED is disposed on the circuit board and has two conductive leads on opposite sides thereof. The insulator is disposed on the circuit board, having an opening and two protruding sheets. The metal barrier is disposed on the insulator, wherein the LED and the protruding sheets are extended through the metal barrier. The conductive leads are insulated from the metal barrier by the protruding sheets of the insulating member.

14 Claims, 7 Drawing Sheets

LAMP MODULE

CROSS REFERENCE TO RELATED APPLICATIONS

This Application claims priority of Taiwan Patent Application No. 099127638, filed on Aug. 19, 2010, the entirety of which is incorporated by reference herein.

BACKGROUND OF THE INVENTION

1. Field of the Invention

This application relates in general to a lamp module and in particular to an LED lamp module with easy assembly and high safety.

2. Description of the Related Art

In the recent years, LEDs have been increasingly used in general illumination products. Some standards for safety of luminaries have been provided, such as UL 1598. According to the UL 1598 standard for safety of luminaries, a barrier should be disposed in the luminaire to cover the circuit board, thus reducing the risk of shock or injury to persons. Particularly, a barrier shall be constructed of one of the following:

(a) ferrous or nonferrous metal at least 0.41 mm (0.016 in) thick;

(b) glass or ceramic at least 3 mm (0.118 in) thick;

(c) impregnated glass fiber sleeving at least 0.25 mm (0.010 in) thick that is rated for the temperature involved;

(d) vulcanized fiber at least 0.71 mm (0.028 in) thick; or (e) a polymeric material that complies with Clause 5.7.1.6 in the UL 1598 standard for safety of luminaries.

In conventional LED luminaries, an insulator is usually provided between a metal barrier and a circuit board to prevent short circuits. Since LEDs are mounted on the circuit board, the insulator usually forms several openings with the LEDs extended therethrough. In this configuration, the conductive leads of the LEDs may contact the metal barrier thorough the openings of the insulator and this may cause safety issues. Additionally, positioning the LEDs into corresponding holes of the barrier can be difficult due to the compact dimensions of the LEDs.

BRIEF SUMMARY OF INVENTION

This application provides a lamp module including a circuit board, an insulator, at least one LED and two metal barriers. The insulator is disposed on the circuit board and includes at least one opening. The LED includes two conductive leads, is disposed on the circuit board and protrudes through the opening of the insulator. The two metal barriers is disposed on the insulator to cover the conductive leads of the LED, wherein the conductive leads are insulated from the metal barriers by the insulator.

In accordance with an aspect of the present invention, the opening is substantially rectangular. The conductive leads of the LED are disposed on two opposite sides of LED. The insulator further includes two protruding sheets on the two opposite sides of the opening and corresponding to the conductive leads of the LED, and the conductive leads are insulated from the metal barrier by the protruding sheets of the insulator.

In accordance with an aspect of the present invention, the lamp module includes a plurality of LEDs arranged in a row, and the insulator includes a plurality of openings with the LEDs protruding therethrough. The circuit board includes a plurality of printed wires electrically connecting the LEDs in a serial manner and covered by the metal barriers with the insulator between the circuit board and the metal barriers for meeting safety standard of luminaries. The printed wires are substantially disposed on the two sides of the row of the LEDs and covered by the metal barriers in pair with the insulator between the circuit board and the metal barriers.

In accordance with an aspect of the present invention, each of the metal barriers includes at least one recess, the recess of one of the metal barriers corresponds to that of the other metal barrier, and the LED and the protruding sheets protrude through the recesses of the metal barriers. The recess of one of the metal barriers and its corresponding recess of the other metal barrier substantially form an another opening for allowing the LED protruding therethrough.

In accordance with an aspect of the present invention, the lamp module further includes a heat sink connecting to the circuit board. The lamp module further includes a lens disposed on the metal barriers and over the LED and corresponding to the LED. Each of the metal barriers has at least one positioning slot, the circuit board has at least two first holes, the insulator has at least two second holes, and the lens has at least two pins penetrating through the positioning slots and the first and second holes.

In accordance with an aspect of the present invention, the lamp module further includes a buffer member and a cover disposed on the lens in sequence. The buffer member includes rubber and is disposed between the cover and the lens to form a waterproof function.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
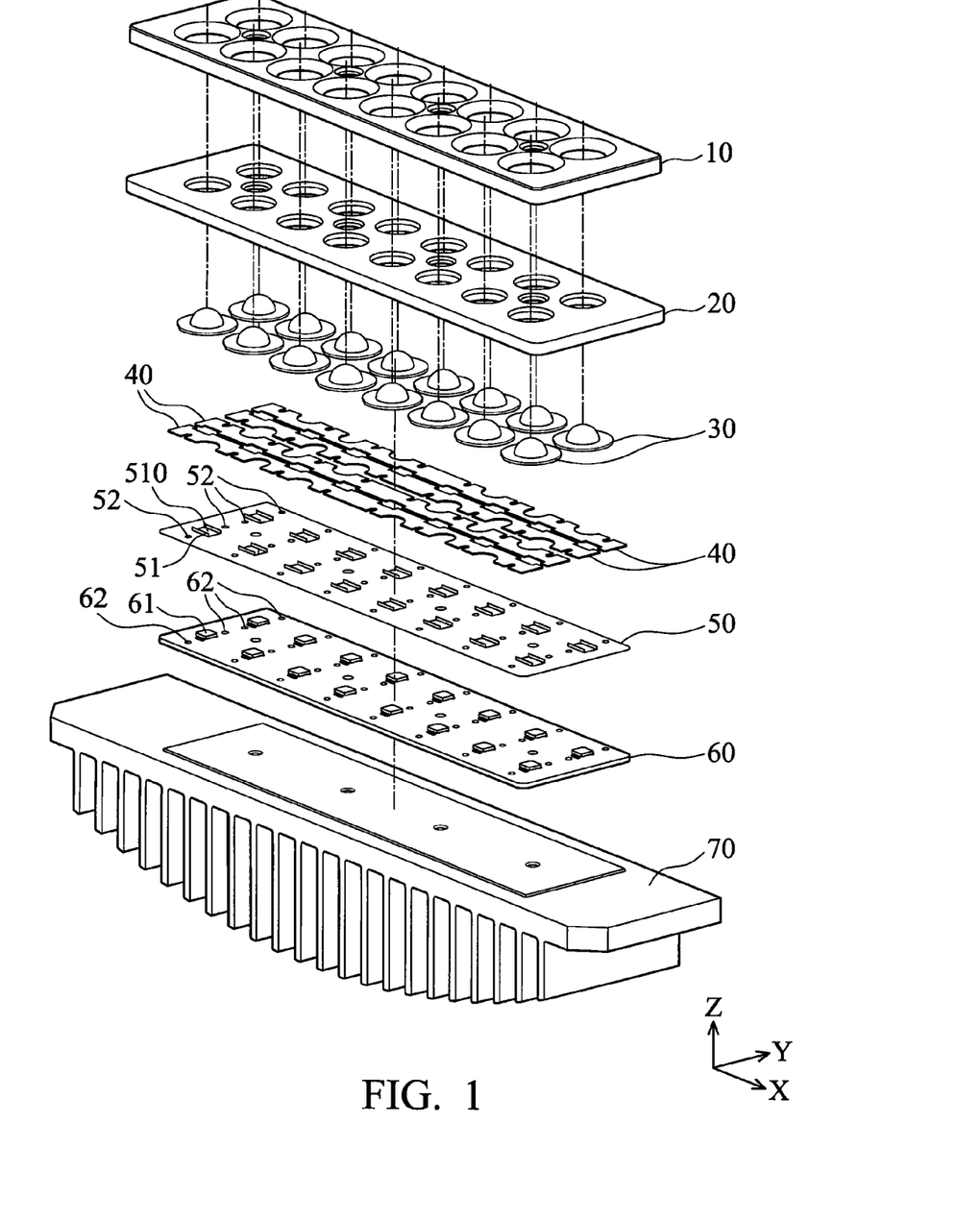
FIG. 1 is an exploded diagram of a lamp module according to an embodiment of the invention.

Referring to FIG. 1, an embodiment of a lamp module primarily comprises a cover 10, a buffer member 20, at least a lens 30, at least a metal barrier 40, an insulator 50, a circuit board 60, at least an LED 61, and a heat sink 70. In this embodiment, the heat sink 70 is disposed below the circuit board 60 for heat dissipation, and a plurality of LEDs 61 is disposed on the circuit board 60. As shown in FIG. 1, the heat sink 70 may comprise metal material with high thermal coefficients, wherein a plurality of fin structures is formed at the bottom of the heat sink 70 for rapid dissipation of heat.

The insulator 50, the metal barriers 40, the lenses 30, the buffer member 20, and the cover 10 are sequentially stacked on the circuit board 60, wherein the plurality of metal barriers 40 all meet the UL 1598 standard for safety of luminaries. However, the lamp module can also use only one metal barrier 40 to cover the electronic components inside the lamp module, thus reducing the risk of shock or injury to persons. Additionally, the buffer member 20 in FIG. 1 may comprise rubber and is disposed between the cover 10 and the lenses 30 to form a waterproof function.

Figure 2:
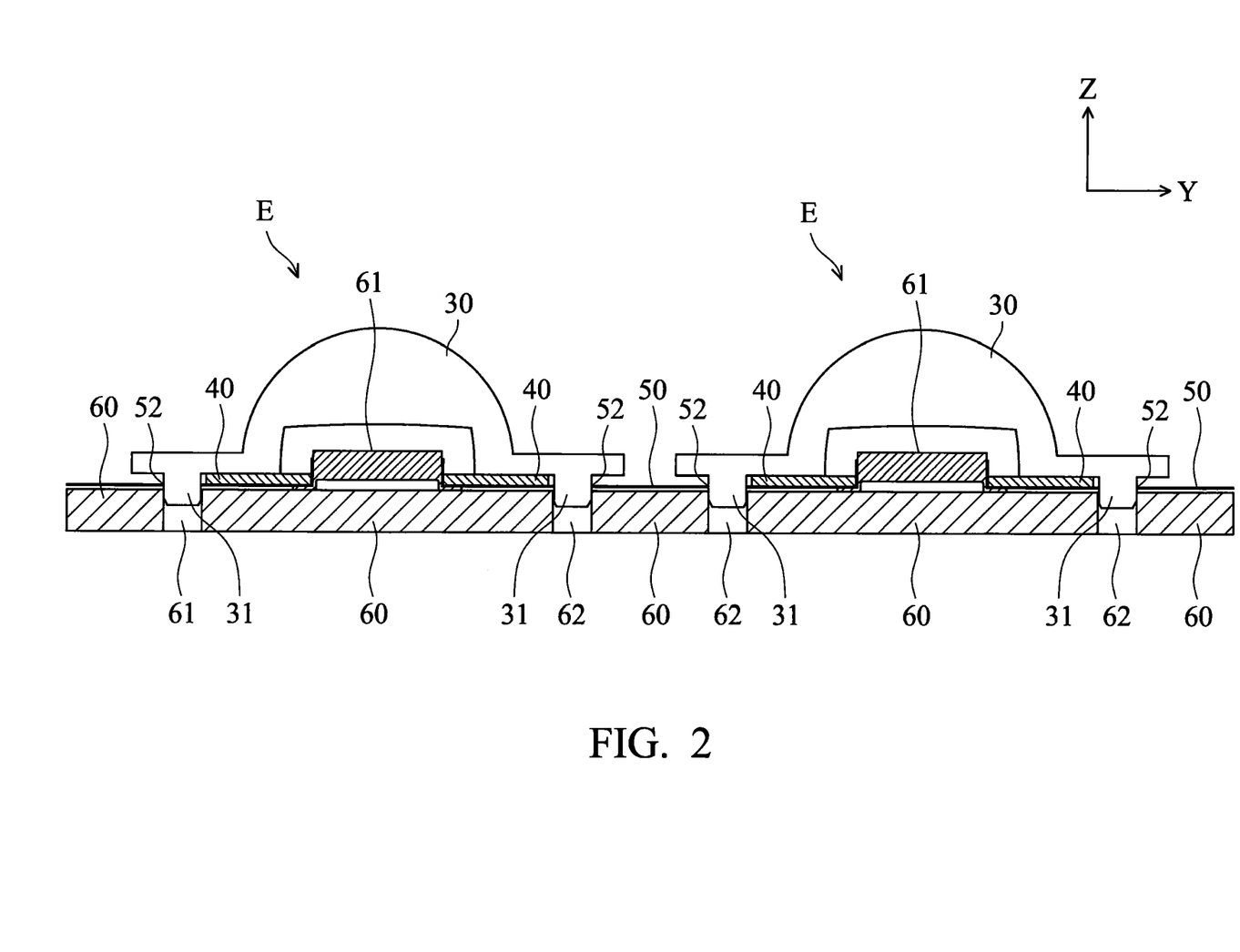
FIG. 2 is a sectional view of the lens, the metal barrier, the insulator, and the circuit board after assembly according to an embodiment of the invention.
Figure 3:
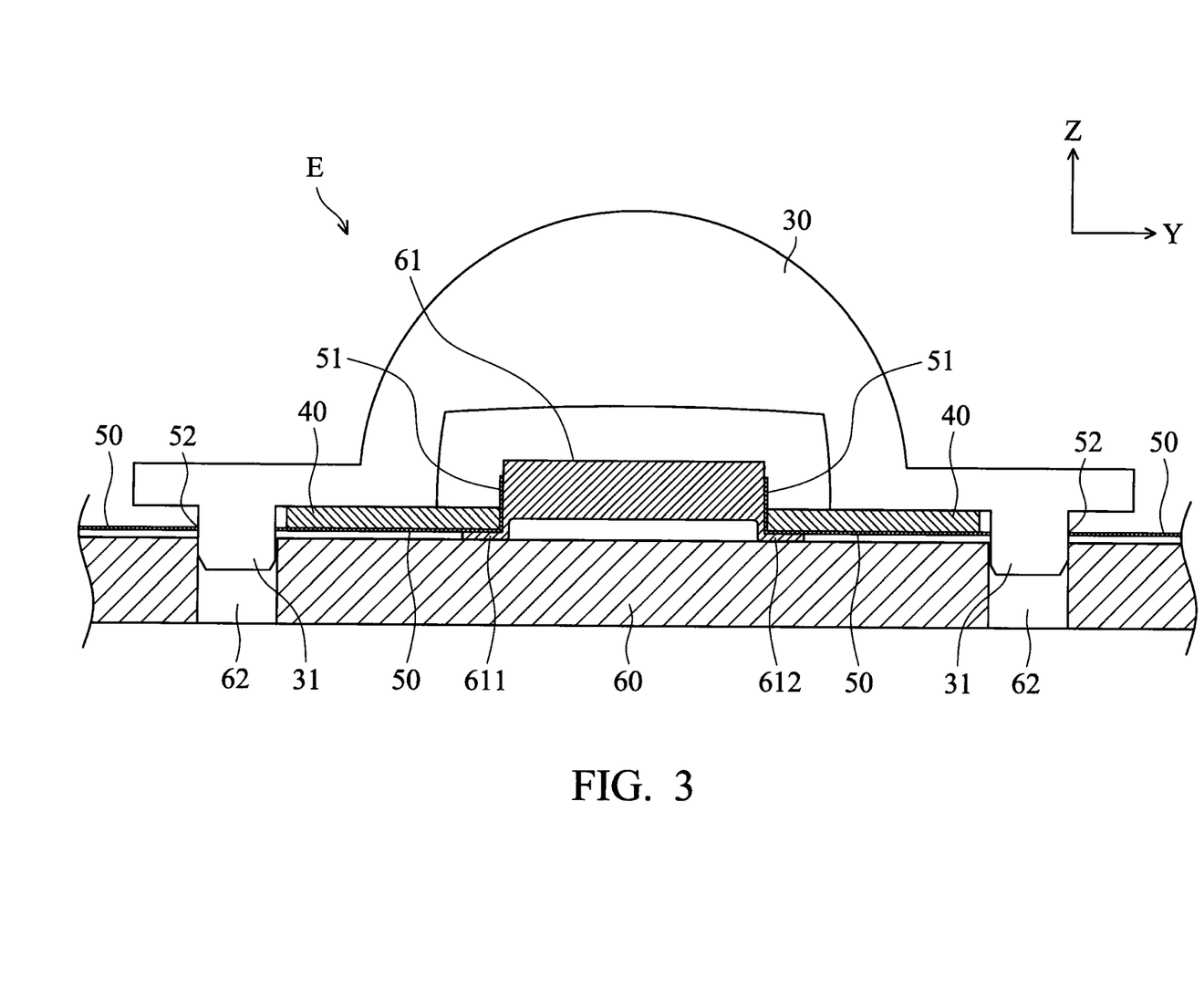
FIG. 3 is an enlarged view of the lighting unit in FIG. 2.

FIG. 2 is a sectional view of the lens 30, the metal barrier 40, the insulator 50, and the circuit board 60 after assembly, and FIG. 3 is an enlarged view of the lighting unit E in FIG. 2. As shown in FIG. 2, the insulator 50 is disposed on the circuit board 60, and the LEDs 61 protrude through the openings of the insulator 50. The lens 30 and the metal barrier 40 are disposed on the insulator 50 to form a lighting unit E. Light is emitted from the LED 61 and through the lens 30 for illumination.

In this embodiment, each of the lenses 30 has two pins 31 joined in a first hole 62 of the circuit board 60 and a second hole 52 of the insulator 50, such that the lenses 30 are fixed to the metal barrier 40 and the insulator 50.

As shown in FIG. 1, the insulator 50 has at least an opening 510. The opening 510 is substantially rectangular. The insulator 50 further includes two protruding sheets 51 disposed on opposite sides of the opening 510. Referring to FIG. 3, during assembly, the LED 61 protrudes through the opening of the insulator 50, wherein the two protruding sheets 51 abut the opposite sides of the LED 61. Thus, the conductive leads 611 and 612 on opposite sides of the LED 61 can be covered by the protruding sheets 51. Owing to the protruding sheets 51 disposed on opposite sides of the opening 510, contact between the metal barrier 40 and the conductive leads 611 and 612 of the LED 61 is prevented. Moreover, the metal barrier 40 can also be insulated from the circuit board 60 by the insulator 50, thus preventing short circuits and improving safety of the lamp module.

Figure 4:
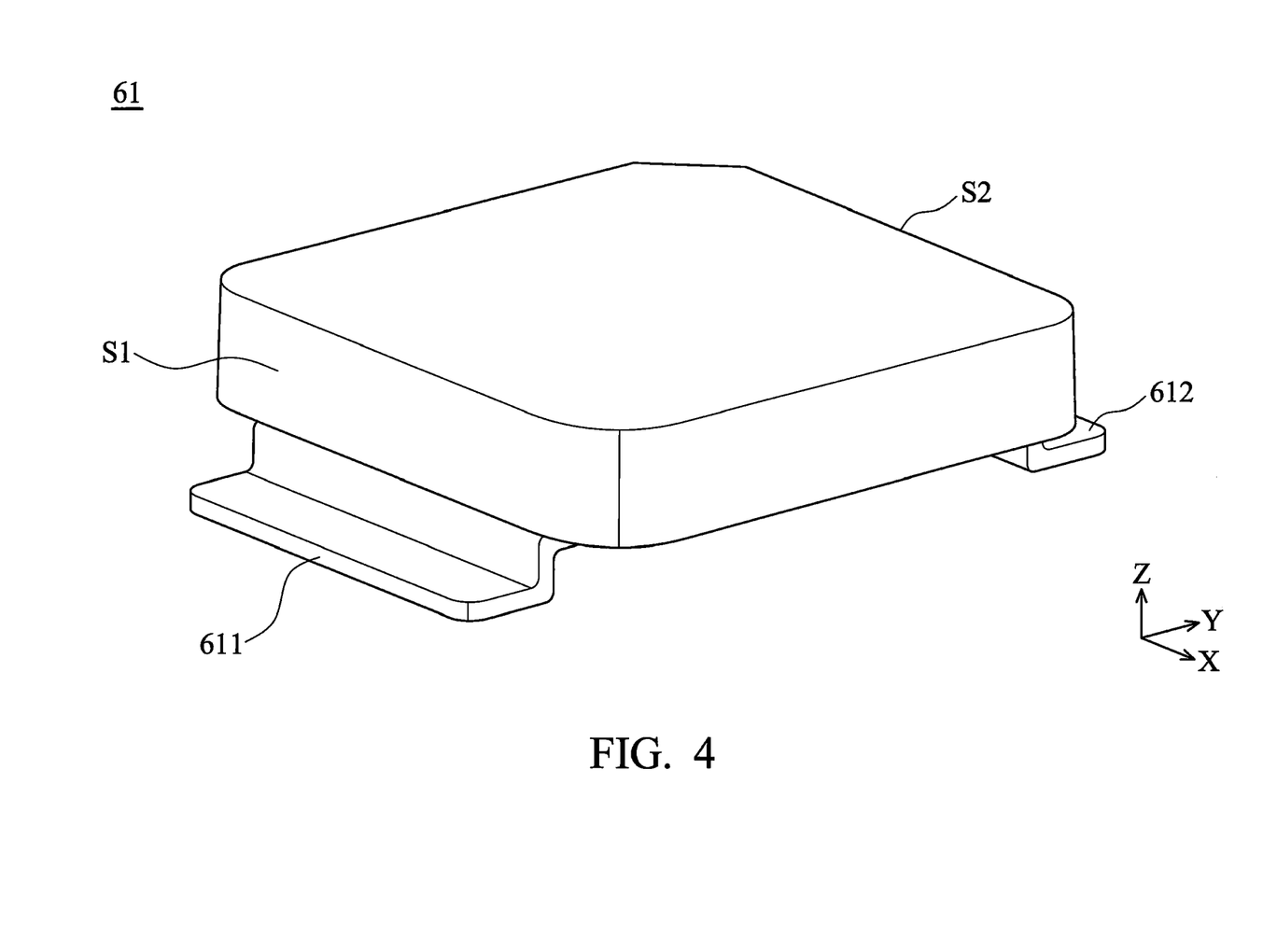
FIG. 4 is a perspective diagram of an LED according to an embodiment of the invention.
Figure 5:
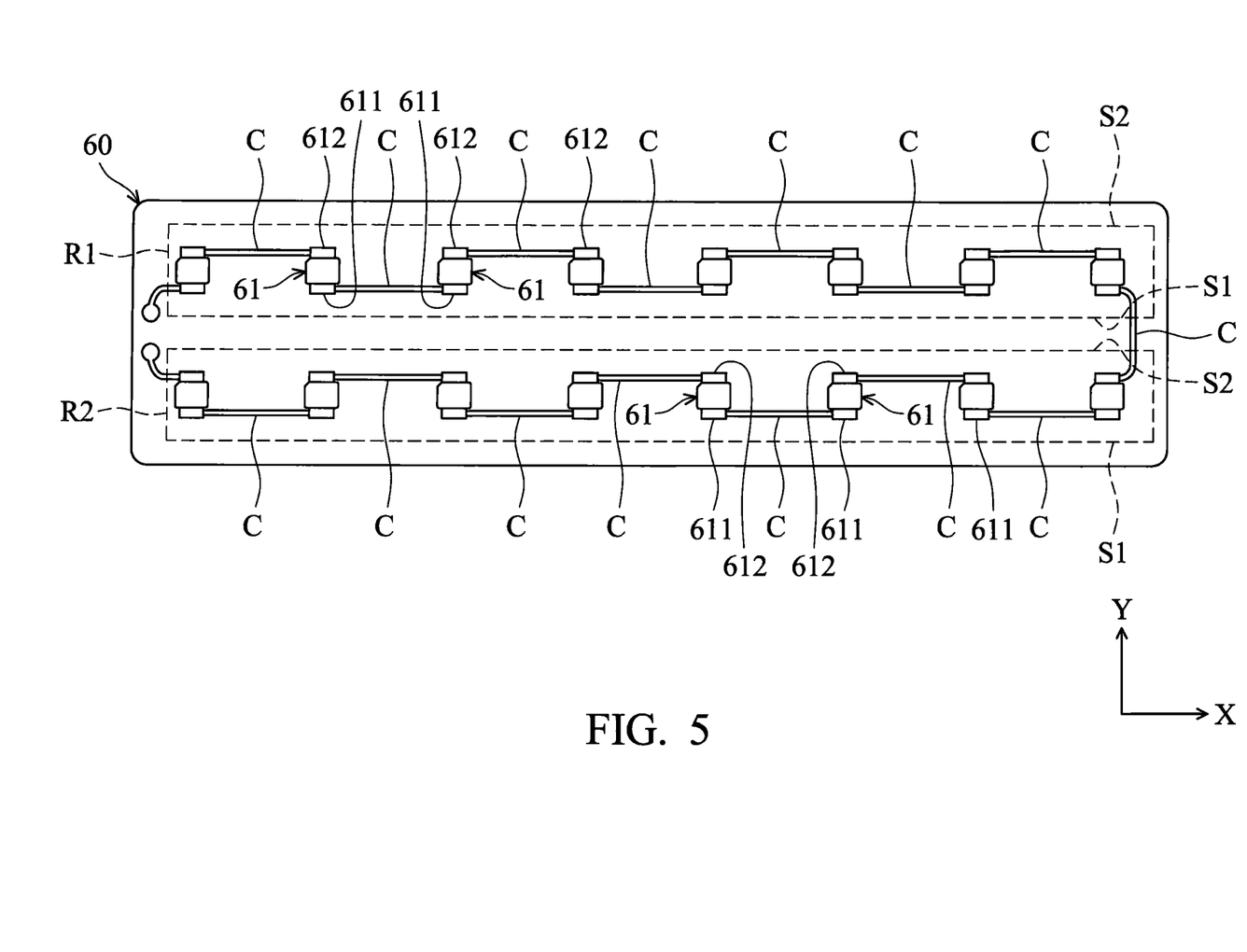
FIG. 5 is a perspective diagram of a plurality of LEDs electrically connected by printed wires according to an embodiment of the invention.

Referring to FIG. 4, an embodiment of the LED 61 is substantially rectangular and comprises two conductive leads 611 and 612, respectively on a first side S1 and a second side S2 thereof. A plurality of LEDs 61 may be arranged in a matrix on the circuit board 60. As shown in FIG. 5, an embodiment of the LEDs 61 are electrically connected in a serial manner and arranged in a first row R1 and a second row R2. However, the LEDs 61 can also be arranged in a single row. The LEDs 61 of FIG. 5 are arranged along a longitudinal direction (the X axis) of the circuit board 60, wherein the conductive leads 611 of the LEDs 61 are on the first side S1, and the conductive leads 612 of the LEDs 61 are on the second side S2.

In this embodiment, the circuit board 60 includes a plurality of printed wires C electrically connecting the LEDs 61 in a serial manner. The printed wires C are majorly disposed at two sides of the row of the LEDs 61 and covered by the metal barriers 40 with the insulator 50 therebetween. The LEDs 61 are electrically connected by printed wires C along the X axis. Since the conductive leads 611 and 612 are respectively on the bottom and top sides (the first and second sides S1 and S2) of the LEDs 61, two metal barriers 40 may be assembled together side by side respectively from the bottom and top sides, to cover the conductive leads 611 and 612 in each row of the LEDs 61. Thus, exposure of the conductive leads 611 and 612 can be prevented, and safety of the lamp module can be improved. It is noted that the left and right sides of the LEDs 61 have no conductive leads, so the metal barriers 40 can be easily assembled from the bottom and top sides to cover all of the conductive leads 611 and 612. According to this configuration, the precision requirement for assembling can be reduced. Moreover, assembly is simplified and the lamp module is made safer.

Figure 6:
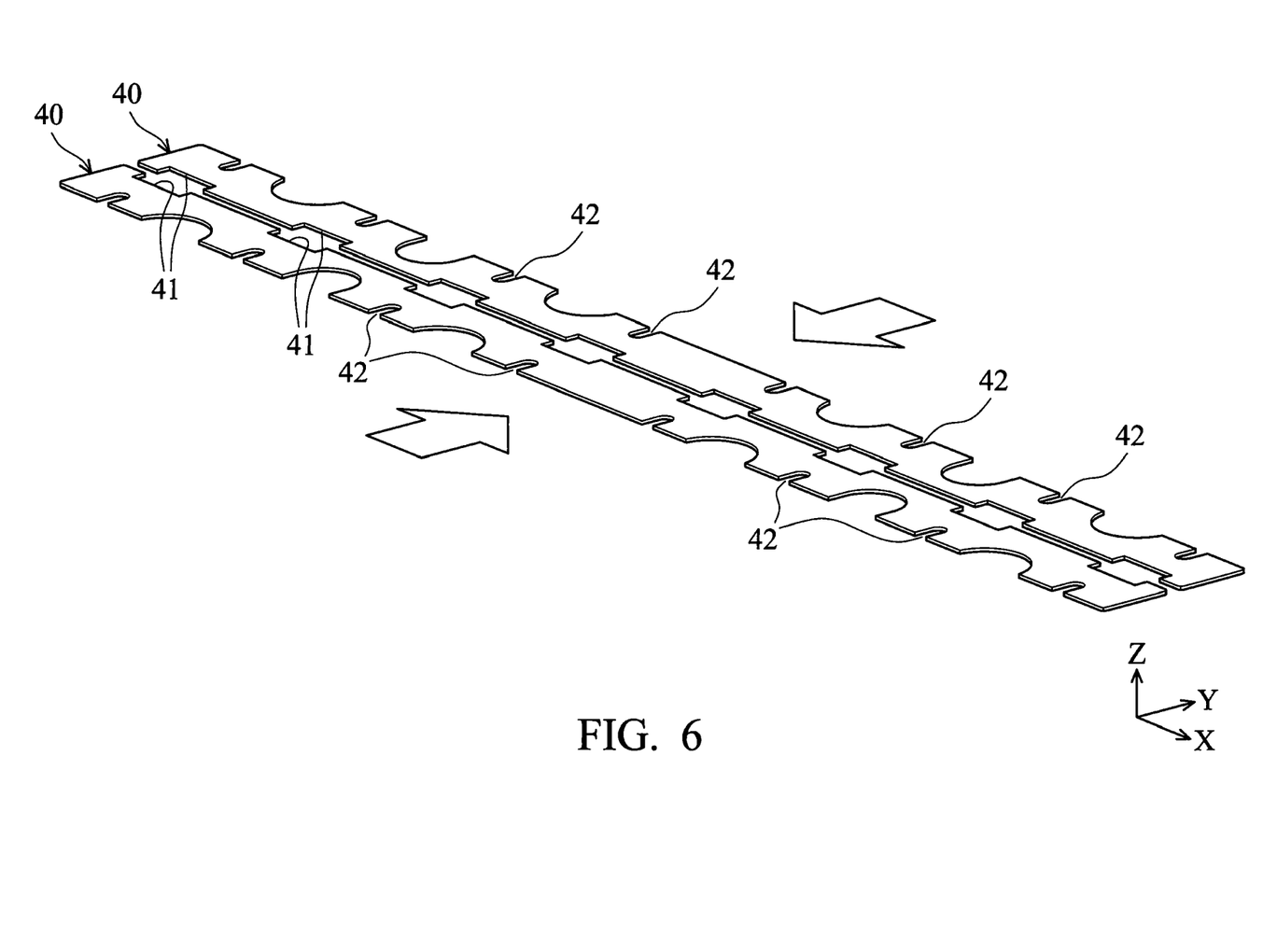
FIG. 6 is a perspective diagram of two metal barriers arranged side by side.
Figure 7:
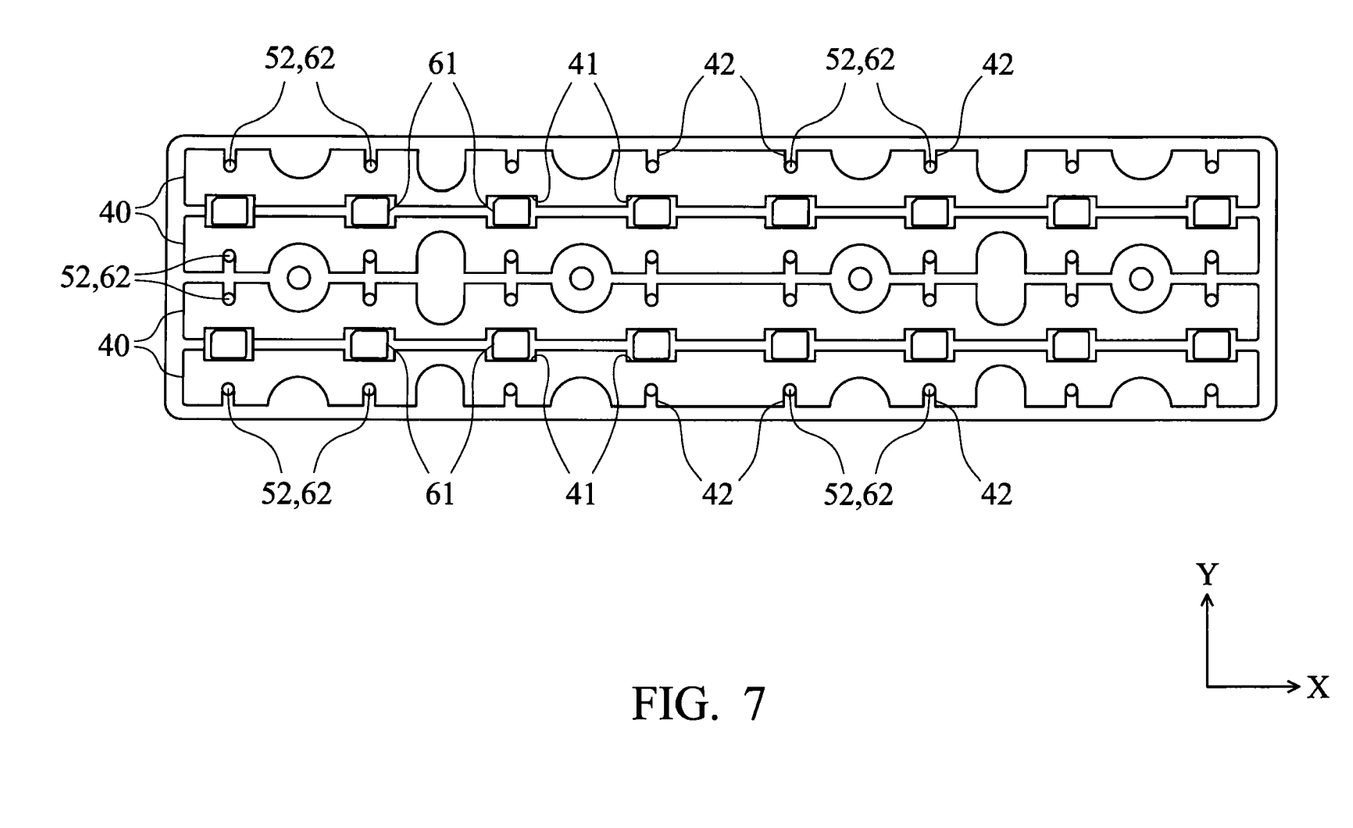
FIG. 7 is a top view of the metal barriers covering the conductive leads on opposite sides of the LEDs.

Referring to FIGS. 6 and 7, two metal barriers 40 are arranged side by side to cover the conductive leads 611 and 612 in each row of the LEDs 61. Here, each of the metal barriers 40 has at least one recess 41, wherein the recesses 41 are substantially rectangular and arranged in pairs. During assembly, as shown in FIGS. 6 and 7, the recesses 41 of the two metal barriers 40 are aligned with each other and substantially form at least an opening. Specifically, the LED 61 and the protruding sheets 51 of the insulator 50 (FIGS. 2 and 3) are extended upwardly (along the Z direction) through the opening formed by the recesses 41. Thus, the LED 61 can emit light through the lens 30 for illumination.

The metal barrier 40 may further have at least one positioning slot 42 with the pin 31 of the lens 30 joined therewith, as shown in FIGS. 6 and 7. Since the pin 31 is joined in a first hole 62 of the circuit board 60 and a second hole 52 of the insulator 50, the metal barrier 40 is restricted by the pin 31 and prevented from sliding along the XY plane. Additionally, since the metal barrier 40 can be positioned on the insulator 50 by the pins 31 of the lens 30, screws or fasteners can be saved to reduce production cost.

The invention provides a lamp module including a circuit board, at least one LED, a metal barrier, and an insulator disposed between the metal barrier and the circuit board. The insulator has at least an opening and two protruding sheets on opposite sides of the opening, corresponding to the conductive leads of the LED. Thus, the metal barrier and the conductive leads of the LED are insulated from each other, so as to prevent short circuits and improve safety of the lamp module. In some embodiments, two metal barriers may be provided and arranged side by side to cover the conductive leads of the LED. In this configuration, the precision requirement for assembling can be reduced, and electrical insulation and safety of the lamp module are improved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A lamp module comprising:
   a circuit board;
   an insulator disposed on the circuit board and comprising at least one opening;
   at least one LED comprising two conductive leads, disposed on the circuit board and protruding through the opening of the insulator; and
   two metal barriers disposed on the insulator to cover the conductive leads of the LED, wherein the conductive leads are insulated from the metal barriers by the insulator, the metal barriers are in pair with the insulator between the circuit board and the metal barriers, each of the metal barriers comprise at least one recess, and the recess of one of the metal barriers corresponds to that of the other metal barrier.

2. The lamp module as claimed in claim 1, wherein the opening is substantially rectangular.

3. The lamp module as claimed in claim 1, wherein the conductive leads of the LED are disposed on two opposite sides of LED.

4. The lamp module as claimed in claim 3, wherein the insulator further comprises two protruding sheets on the two opposite sides of the opening and corresponding to the conductive leads of the LED, and the conductive leads are insulated from the metal barrier by the protruding sheets of the insulator.

5. The lamp module as claimed in claim 1, wherein the lamp module comprises a plurality of LEDs arranged in a row, and the insulator comprises a plurality of openings with the LEDs protruding therethrough.

6. The lamp module as claimed in claim 5, wherein the circuit board comprises a plurality of printed wires electrically connecting the LEDs in a serial manner and covered by the metal barriers with the insulator between the circuit board and the metal barriers for meeting safety standard of luminaries.

7. The lamp module as claimed in claim 6, wherein the printed wires are substantially disposed on the two sides of the row of the LEDs and covered by the metal barriers.

8. The lamp module as claimed in claim 4, wherein the LED and the protruding sheets protrude through the recesses of the metal barriers.

9. The lamp module as claimed in claim 8, wherein the recess of one of the metal barriers and its corresponding recess of the other metal barrier substantially form an another opening for allowing the LED protruding therethrough.

10. The lamp module as claimed in claim 1, wherein the lamp module further comprises a heat sink connecting to the circuit board.

11. The lamp module as claimed in claim 1, further comprising a lens disposed on the metal barriers and over the LED and corresponding to the LED.

12. The lamp module as claimed in claim 11, wherein each of the metal barriers has at least one positioning slot, the circuit board has at least two first holes, the insulator has at least two second holes, and the lens has at least two pins penetrating through the positioning slots and the first and second holes.

13. The lamp module as claimed in claim 11, further comprising a buffer member and a cover disposed on the lens in sequence.

14. The lamp module as claimed in claim 13, wherein the buffer member comprises rubber and is disposed between the cover and the lens to form a waterproof function.

* * * * *